United States Patent [19]

Mori et al.

[11] Patent Number: 5,275,688

[45] Date of Patent: Jan. 4, 1994

[54] MONOCRYSTAL GROWTH METHOD

[75] Inventors: Teruo Mori; Shigeo Okamoto, both of Sakura; Kazunori Hirose, Chiba, all of Japan

[73] Assignee: TDK Corporation, Tokyo, Japan

[21] Appl. No.: 885,740

[22] Filed: May 19, 1992

[51] Int. Cl.$^5$ .............................................. C30B 13/02
[52] U.S. Cl. ............................. 156/620.7; 156/620.71; 156/620.73; 148/103; 505/1
[58] Field of Search ........... 156/620.7, 620.71, 620.73; 148/103, 105; 505/1

[56] References Cited

U.S. PATENT DOCUMENTS

| | | |
|---|---|---|
| 3,949,351 | 4/1976 | Clark et al. |
| 4,152,178 | 5/1979 | Malekzadeh et al. |
| 4,158,368 | 6/1979 | Clark |
| 4,308,474 | 12/1981 | Savage et al. |
| 4,375,372 | 3/1983 | Koon et al. |
| 4,378,258 | 3/1983 | Clark et al. |
| 5,057,492 | 10/1991 | Oka et al. ........................ 156/620.7 |

OTHER PUBLICATIONS

IEEE Transactions on Magnetics, vol. MAG-22, No. 5, (Sep., 1986), pp. 973-975, A. E. Clark, "Magnetostriction in Twinned [112] Crystals of $Tb_{.27}Dy_{.73}Fe_2$".

*Primary Examiner*—Olik Chaudhuri
*Assistant Examiner*—Felisa Garrett
*Attorney, Agent, or Firm*—Oblon, Spivak, McClelland, Maier & Neustadt

[57] ABSTRACT

A monocrystal of a R-T intermetallic compound containing R (at least one lanthanide element inclusive of Y) and T (at least one transition metal element such as Fe, Co, Ni, Cr and Mn) is grown by a solid phase method. First a precursor in which a primary phase of the intermetallic compound and a low-melting eutectic crystal phase exist is prepared. The precursor is successively heated from one end to another end while it is often contacted at one end with a seed crystal. Then the low-melting eutectic crystal phase functions as a flux intergranular substance to ensure the consistent manufacture of a monocrystal aligned with the crystallographic orientation of the seed crystal or at the start-of-heating point.

12 Claims, No Drawings

MONOCRYSTAL GROWTH METHOD

FIELD OF THE INVENTION

This invention relates to a method for growing a monocrystal of an intermetallic compound containing R (at least one of Y and lanthanides) and T (at least one of transition metal elements).

BACKGROUND OF THE INVENTION

For the manufacture of monocrystals of various metals, ceramics and the like, a number of techniques are known in the art as listed below.

(1) Unidirectional solidification involving melting followed by unidirectional cooling for solidification, resulting in aligned crystallographic orientation.

(2) Bridgman method involving pulling up a melt while allowing solidification in alignment with a monocrystalline plane.

(3) Zone melt method which is one form of the unidirectional solidification.

(4) Molding in a magnetic field.

(5) Vapor phase method including evaporation, sputtering, CVD, etc.

(6) Solid phase reaction method in which a ceramic monocrystal is prepared by interposing a flux of a material other than the elements of a ceramic such as glass between a monocrystal and a polycrystal and successively moving a heating zone, thereby utilizing movement of the flux along the grain boundary.

There are also known magnetostrictive materials in the form of $RT_2$ intermetallic compounds such as $RFe_2$. These materials are prepared (a) by unidirectional solidification and zone melting methods as disclosed in U.S. Pat. Nos. 4,308,474, 3,949,351, 4,378,258, 4,375,372, and 4,158,368.

Although it is described in these patents that monocrystals of $RFe_2$ were obtained, Sm systems or the like could not be obtained in monocrystalline form because of peritectic formation during solidification. According to the report of the same inventor in IEEE Transactions on Magnetics, Vol. MAG.-22, No. 5, September 1986, $(Tb_xDy_{1-x})Fe_2$ acquired (112) orientation. The (112) orientation, however, is low in magnetostriction, especially in magnetostriction during magnetization process as compared with (111) orientation.

Also, U.S. Pat. No. 4,308,474 discloses (b) $RT_2$ prepared by Bridgman method. This does not yield a monocrystal oriented in (111) direction.

Further, U.S. Pat. No. 4,152,178 discloses (c) that molding is finished in a magnetic field in preparing $RT_2$ by powder metallurgy. This does not yield a monocrystal.

No examples are known as to the use of solid phase reaction process for $RT_2$ intermetallic compounds. This is also true for other R-T intermetallic compounds.

DISCLOSURE OF THE INVENTION

A primary object of the present invention is to provide a novel monocrystal growth method of R-T intermetallic compounds.

This and other objects are achieved by the present invention which is defined below from (1) to (12).

(1) A method for growing a monocrystal of an intermetallic compound containing R which is at least one element of Y and lanthanides and T which is at least one element of transition metal elements, comprising the steps of:

allowing a primary phase of said intermetallic compound and a low-melting eutectic crystal phase to exist, and shifting the monocrystal interface for growing the monocrystal by utilizing the low-melting eutectic crystal phase as a flux intergranular substance.

(2) The monocrystal growth method of (1) wherein a polycrystalline or prismatic precursor in which the primary phase and the low-melting eutectic crystal phase exists is heated at one end to a temperature at which the low-melting eutectic crystal phase melts, but the primary phase does not, and the heating zone is gradually moved toward another end of the precursor, thereby obtaining a monocrystal aligned with the crystallographic orientation at the start-of-heating point.

(3) The monocrystal growth method of (2) wherein the primary phase has a mean grain size of up to 200 $\mu$m.

(4) The monocrystal growth method of (2) wherein said intermetallic compound contains R and T and optionally, at least one element selected from the group consisting of B, C and P.

(5) The monocrystal growth method of (4) wherein said T is at least one element selected from the group consisting of Fe, Co, Ni, Mn, and Cr.

(6) The monocrystal growth method of (5) wherein said primary phase consists of $RT_2$ and said low-melting eutectic crystal phase consists essentially of $R_2T$.

(7) The monocrystal growth method of (1) wherein a polycrystalline or prismatic precursor in which the primary phase and the low-melting eutectic crystal phase exists is contacted at one end with a seed crystal, the contact zone is heated to a temperature at which the low-melting eutectic crystal phase melts, but the primary phase does not, and the heating zone is gradually moved toward another end of the precursor, thereby obtaining a monocrystal having the same crystallographic orientation as the seed crystal.

(8) The monocrystal growth method of (7) wherein the primary phase has a mean grain size of up to 200 $\mu$m.

(9) The monocrystal growth method of (7) wherein said intermetallic compound contains R and T and optionally, at least one element selected from the group consisting of B, C and P.

(10) The monocrystal growth method of (9) wherein said T is at least one element selected from the group consisting of Fe, Co, Ni, Mn, and Cr.

(11) The monocrystal growth method of (10) wherein said primary phase consists of $RT_2$ and said low-melting eutectic crystal phase consists essentially of $R_2T$.

(12) The monocrystal growth method of any one of (7) to (10) wherein the monocrystal has a crystallographic orientation in (111) direction.

DESCRIPTION OF THE PREFERRED EMBODIMENT

The illustrative organization of the present invention is described in detail.

The present invention is directed to a single crystal growth method of compounds containing R and T wherein R represents at least one element of Y and lanthanide elements and T represents at least one element of transition metal elements. Preferably, T represents one to five elements selected from the group consisting of Fe, Co, Ni, Mn and Cr, and inclusion of one or more other transition metal elements is acceptable in this embodiment.

Accordingly, the monocrystals resulting from the present invention include $RT_2$, $RT_3$, $RT_5$, $R_2T_{17}$, $R_6T_{23}$ and the like. $RT_2$ is preferred among these because of ease of control.

Further, the R-T intermetallic compounds may contain one to three elements selected from the group consisting of B, C and P, especially B and/or C. This implies that $R_2Fe_{14}B_7$ and the like are included. It is to be noted that these intermetallic compounds may further contain up to 3 at % of an element such as Mo, Zr, W, etc.

These intermetallic compounds are produced as anisotropic monocrystals with aligned crystallographic orientation by first allowing a primary phase of a desired intermetallic compound and a eutectic crystal or eutectic mixture phase having a lower melting point than the primary phase to exist and successively shifting the monocrystal interface for growing the monocrystal by utilizing the low-melting eutectic crystal phase as a flux intergranular substance.

More particularly, there is furnished a precursor in the form of a block, preferably a rod in which a primary phase of an intermetallic compound and a low-melting eutectic crystal phase exist. The low-melting eutectic crystal phase may be comprised of an intermetallic compound which is R richer than the primary phase or a mixture thereof, for example, principally $R_2T$ for the primary phase of $RT_2$.

Preferably, the low-melting eutectic crystal phase calculated as the R-T compound is present in an amount of about 0.1 to 30 mol % based on the R-T compound forming the primary phase and in an amount of about 0.05 to 15 vol % in the precursor as a different phase.

The precursor may have a microscopic structure of isotropic polycrystal. Then the primary phase may have a mean grain size of up to 200 μm, especially about 1 to 200 μm. Also acceptable are dendrite, resinous, or laminar prismatic structures which may be anisotropic in crystallographic orientation. In these cases, the eutectic crystal phase is present as an intergranular phase.

Such precursors may be prepared to any desired shape by an arc melting method, high-frequency melting method, powder metallurgy, rapid quenching method, centrifugal casting method, unidirectional solidification or the like, while use of a zone melting method is also acceptable.

The precursor is heated at one end and the heating zone is gradually moved from the one end to the other end of the precursor. Heating is to a temperature at which the low-melting eutectic crystal phase melts, but the primary phase does not. For example, since $RT_2$ has a melting point of 900 to 1300° C. and the $R_2T$ eutectic crystal phase has a melting point of 600 to 800° C., heating is to a temperature somewhere between these temperatures.

In this embodiment, the heating temperature is preferably above the temperature 50° C. higher than the melting point of the eutectic crystal phase, but below the temperature 50° C. lower than the melting point of the primary phase. More particularly, for the primary phase of $RT_2$, a heating temperature of 800 to 1250° C. is preferred from the standpoint of stable crystal growth. Heating may be carried out by any desired means such as high-frequency induction heating and heater heating and the heating zone may be moved at a rate of about 1 to 500 mm/hr.

Through such solid phase reaction, the precursor converts into a monocrystal aligned with the crystallographic orientation at the start-of-heating point. For those precursors including a site having a crystallographic orientation of (112) at one end (the start-of-heating point), for example, precursors prepared by a centrifugal casting method with concomitant unidirectional cooling, there are obtained monocrystals which have grown in (112) direction. Consequently, the start-of-heating point becomes a seed crystal equivalent site functioning as a seed crystal. By utilizing this phenomenon for growth according to the present invention, there is obtained a monocrystal having a crystallographic orientation of (112) which is different from the dendrite structure.

Instead of providing a seed crystal equivalent site at the start-of-heating point, it is possible to bring a seed crystal corresponding to the desired monocrystal in contact with one end surface of a rod as the precursor, and move the heating zone from this point of contact as the starting point. In this embodiment, there is obtained a monocrystal having the same crystallographic orientation as the seed crystal.

The seed crystal corresponding to the monocrystal may be obtained by growing a polycrystal to a size of the order of 0.2 mm, determining its crystallographic orientation by X-ray diffractometry, and cutting in the thus determined direction. There is obtained a monocrystal aligned with the crystallographic orientation of the seed crystal. If the seed crystal has a crystallographic orientation of (111), then the resulting monocrystal exhibits excellent magnetic properties including magnetostriction. It is to be noted that the monocrystals thus obtained have a mean grain size of 200 μm or more. As the case may be, a monocrystal can be formed throughout the precursor.

During such solid phase reaction, the primary phase as a major component undergoes no or little motion. Monocrystallization is accomplished even when a peritectic region is found in the molten/solidified phase diagram.

It is to be understood that dense, defect-free, homogeneous precursors are generally used although porous precursors can be used to form porous monocrystals.

EXAMPLE

Examples of the present invention are given below by way of illustration.

Example 1

Rod-shaped monocrystalline and isotropic polycrystalline precursors having a composition $(Tb_xDy_{1-x})Fe_y$ wherein x and y are as shown in Table 1 were fabricated as a $RT_2$ system by a centrifugal casting method with unidirectional cooling and an arc melting method, respectively. The $RT_2$ phase had a mean grain size of about 1 to 200 μm and a $R_2T$ eutectic crystal phase was found as a different phase. It is to be noted that in the R compositions of Table 1, $RT_2$ and $R_2T$ had a melting point of about 1270° C. and about 850° C., respectively.

The rod-shaped precursors had a diameter of 4 to 8 mm and a length of 600 mm. Those precursors formed by unidirectional cooling/centrifugal casting and comprised of a start-of-heating point (rod bottom) of (112) orientation and the balance of fine polycrystals, that is, having a seed crystal equivalent site of (112) orientation were heated by means of a high-frequency induction heating coil which was moved at the temperature shown in Table 1, thereby heating the heating zone to the surface temperature shown in Table 1. The precursors had a diameter of 4 mm at one end corresponding to the start-of-heating point.

The rod-shaped isotropic polycrystalline precursor formed by arc melting was similarly heated with a seed crystal of (111) orientation secured to one end of the precursor in close contact. Additionally, the rod-shaped polycrystalline precursor formed by centrifugal casting was similarly heated with a seed crystal of (111) orientation secured thereto in close contact.

As a result, there were obtained monocrystalline products including from partially monocrystalline ones having a mean grain size of at least 200 μm to entirely monocrystalline ones and having a crystallographic orientation of (112) or (112). More particularly, those polycrystalline precursors by centrifugal casting were converted, by solid phase reaction without a seed crystal, into monocrystals having crystallographic orientation aligned with (112) direction. Those isotropic polycrystalline precursors by arc melting or centrifugal casting were converted with the aid of (111) seed crystals into monocrystals aligned with (111) orientation.

The precursors before growth and the monocrystals after growth were measured for magnetostrictive quantity λ. For measurement, the optical Doppler method was used to determine λ at an applied magnetic field of 0.4 kOe and 1 kOe. Table 1 reports λ of the precursors and monocrystals and the percent increases of λ over the precursors in parentheses.

termined direction of the seed crystal, offering the advantage that as opposed to unidirectional solidification techniques such as zone melting wherein the crystallographic orientation is restricted by the inherent orientation of crystal, monocrystals with any desired crystallographic orientation can be produced. The monocrystals are significantly improved in requisite magnetic properties such as magneto-striction.

We claim:

1. A method for growing a monocrystal of an intermetallic compound containing R which is at least one element of Y and lanthanides and T which is at least one element of transition metal elements, comprising the steps of:

allowing a primary phase of said intermetallic compound and a low-melting eutectic crystal phase to exist, and shifting the monocrystal interface for growing the monocrystal by heating to a temperature at which the low-melting eutectic crystal phase melts, but the primary phase does not, and utilizing the low-melting eutectic crystal phase as a flux intergranular substance.

2. The monocrystal growth method of claim 1 wherein a polycrystalline or prismatic precursor in which the primary phase and the low-melting eutectic crystal phase exists is heated at one end to a temperature at which the low-melting eutectic crystal phase melts, but the primary phase does not, and the heating zone is gradually moved toward another end of the precursor, thereby obtaining a monocrystal aligned with the crystallographic orientation at the start-of-heating point.

3. The monocrystal growth method of claim 2 wherein the primary phase has a mean grain size of up to 200 μ.

4. The monocrystal growth method of claim 2 wherein said intermetallic compound contains R and T and optionally, at least one element selected from the group consisting of B, C and P.

5. The monocrystal growth method of claim 4 wherein said T is at least one element selected from the group consisting of Fe, Co, Ni, Mn, and Cr.

6. The monocrystal growth method of claim 5 wherein said primary phase consists of $RT_2$ and said

TABLE 1

| $(Tb_xDy_{1-x})Fe_y$ | | Heating temp. (°C.) | Moving rate (mm/hr) | Seed crystal or equiv. site | Method | Precursor λ (ppm) | | Monocrystal λ (ppm) (increase, %) | |
|---|---|---|---|---|---|---|---|---|---|
| x | y | | | | | 0.4 kOe | 1 kOe | 0.4 kOe | 1 kOe |
| 0.3 | 1.95 | 800 | 20 | (112) | centrifugal cast | 141 | 431 | 409 (190) | 869 (102) |
| 0.3 | 1.925 | 800 | 20 | (112) | centrifugal cast | 71 | 233 | 262 (269) | 590 (153) |
| 0.27 | 1.95 | 920 | 20 | (112) | centrifugal cast | 305 | 719 | 500 (64) | 1000 (39) |
| 0.3 | 1.95 | 920 | 20 | (111) | centrifugal cast | 370 | 746 | 532 (45) | 1803 (141) |
| 0.3 | 1.95 | 970 | 20 | (112) | centrifugal cast | 506 | 940 | 692 (37) | 1061 (29) |
| 0.3 | 1.95 | 1020 | 20 | (112) | centrifugal cast | 317 | 785 | 426 (34) | 967 (23) |
| 0.3 (Fe 1.89, Cr 0.01) | 1.90 | 1020 | 20 | (112) | centrifugal cast | 161 | 487 | 278 (73) | 934 (92) |
| 0.3 | 1.95 | 1120 | 20 | (112) | centrifugal cast | 245 | 574 | 524 (113) | 1016 (77) |
| 0.3 | 1.95 | 970 | 20 | (111) | arc melt | 391 | 763 | 763 (392) | 1785 (211) |

The benefits of the present invention are evident from the data of Table 1.

BENEFITS OF THE INVENTION

The present invention can manufacture monocrystals or single crystals having well aligned crystallographic orientation with no or little concomitant movement of the major component. Unlike the zone melting method, the invention ensures consistent conversion of almost all R-T compounds into monocrystals. Even alloys containing peritectic regions can be converted into monocrystals. There are obtained various monocrystalline magnetic materials of anisotropic nature which are improved in reflectivity and magneto-optical effect. When a seed crystal is used, the resulting monocrystal has crystallographic orientation coincident with the predelow-melting eutectic crystal phase consists essentially of $R_2T$.

7. The monocrystal growth method of claim 1 wherein a polycrystalline or prismatic precursor in which the primary phase and the low-melting eutectic crystal phase exists is contacted at one end with a seed crystal, the contact zone is heated to a temperature at which the low-melting eutectic crystal phase melts, but the primary phase does not, and the heating zone is gradually moved toward another end of the precursor, thereby obtaining a monocrystal having the same crystallographic orientation as the seed crystal.

8. The monocrystal growth method of claim 7 wherein the primary phase has a mean grain size of up to 200 $\mu$m.

9. The monocrystal growth method of claim 7 wherein said intermetallic compound contains R and T and optionally, at least one element selected from the group consisting of B, C and P.

10. The monocrystal growth method of claim 9 wherein said T is at least one element selected from the group consisting of Fe, Co, Ni, Mn, and Cr.

11. The monocrystal growth method of claim 10 wherein said primary phase consists of $RT_2$ and said low-melting eutectic crystal phase consists essentially of $R_2T$.

12. The monocrystal growth method of any one of claims 7 to 10 wherein the monocrystal has a crystallographic orientation in (111) direction.

* * * * *